(12) United States Patent
Merchant et al.

(10) Patent No.: US 6,235,594 B1
(45) Date of Patent: May 22, 2001

(54) METHODS OF FABRICATING AN INTEGRATED CIRCUIT DEVICE WITH COMPOSITE OXIDE DIELECTRIC

(75) Inventors: Sailesh Mansinh Merchant; Pradip Kumar Roy, both of Orlando, FL (US)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/340,224

(22) Filed: Jun. 25, 1999

Related U.S. Application Data
(60) Provisional application No. 60/115,769, filed on Jan. 13, 1999.

(51) Int. Cl.[7] ............................................. H01L 21/336
(52) U.S. Cl. .......................... 438/287; 438/275; 438/249; 438/240
(58) Field of Search ................................. 438/279, 287, 438/240, 275

(56) References Cited

U.S. PATENT DOCUMENTS

| | | | |
|---|---|---|---|
| 5,153,701 | 10/1992 | Roy ........................................... | 357/54 |
| 5,195,018 | 3/1993 | Kwon et al. .......................... | 361/313 |
| 5,438,012 | 8/1995 | Kamiyama .............................. | 437/60 |
| 5,508,221 | 4/1996 | Kamiyama .............................. | 437/60 |
| 5,569,619 | 10/1996 | Roh ......................................... | 437/52 |
| 5,688,724 | 11/1997 | Yoon et al. ........................... | 437/235 |
| 5,780,115 | 7/1998 | Park et al. ............................ | 427/539 |
| 6,025,280 | * 2/2000 | Brady et al. ......................... | 438/762 |
| 6,033,532 | * 3/2000 | Minami . | |
| 6,060,755 | * 5/2000 | Ma et al. .............................. | 257/410 |

FOREIGN PATENT DOCUMENTS

| | | |
|---|---|---|
| 609081 | 8/1994 | (EP) . |
| 851473 | 7/1998 | (EP) . |

OTHER PUBLICATIONS

Patent Abstracts of Japan, vol. 017, No. 625, Nov. 18, 1993 and JP 05 198743A (Mitsubishi Elec Corp.), Aug. 6, 1993.

Cava et al., Enhancement of the Dielectric Constant of $Ta_2O_5$ Through Substitution with $Ti_2O_5$, (MacMillan Journals Ltd.), Sep. 1995, pp. 215–217.

Roy et al., Sythesis of High–Quality Ultra–Thin Gate Oxides for ULSI Applications, AT&T Technical Journal, Nov./Dec. 1988, pp. 155–174.

Roy et al., Synthesis of Ultra–Thin Stacked Oxides Using Low Pressure Single Furnace Cluster Process, Materials Research Society Symp. Procedures, vol. 473, 1997, pp. 89–94.

* cited by examiner

*Primary Examiner*—Long Pham
(74) *Attorney, Agent, or Firm*—Allen, Dyer, Doppelt, Milbrath & Gilchrist, P.A.

(57) ABSTRACT

A method of fabricating an integrated circuit device includes forming a first metal oxide layer adjacent a semiconductor substrate. The first metal oxide layer may be formed of tantalum oxide, for example. A second metal oxide layer, which includes an oxide with a relatively high dielectric constant such as titanium oxide, zirconium oxide, or ruthenium oxide, is formed on the first metal oxide layer opposite the semiconductor substrate, and a metal nitride layer, such as titanium nitride, is formed on the metal oxide layer opposite the first metal oxide layer. The metal nitride layer includes a metal which is capable of reducing the metal oxide of the first metal oxide layer. Thus, the second metal oxide layer substantially blocks reduction of the metal oxide of the first metal oxide layer by the metal of the metal nitride layer.

31 Claims, 4 Drawing Sheets

METHODS OF FABRICATING AN INTEGRATED CIRCUIT DEVICE WITH COMPOSITE OXIDE DIELECTRIC

RELATED APPLICATION

This application is based upon prior filed copending provisional application No. 60/115,769 filed Jan. 13, 1999.

FIELD OF THE INVENTION

The present invention relates to the field of integrated circuits, and, more particularly, to integrated circuit devices with a dielectric layer.

BACKGROUND OF THE INVENTION

Typically, in a metal oxide semiconductor (MOS) transistor, a thin layer of silicon dioxide is grown in the gate region. The oxide functions as a dielectric whose thickness is chosen specifically to allow induction of a charge in the channel region under the oxide. The gate controls the flow of current through the device. In sub-0.5$\mu$m technologies, ultra-thin gate oxides are used for ultra-large-scale-integration (ULSI, more than 10 million transistors per chip).

Also, highly integrated memory devices, such as dynamic-random-access-memories (DRAMs), require a very thin dielectric film for the data storage capacitor. To meet this requirement, the capacitor dielectric film thickness will be below 2.5 nm of $SiO_2$ equivalent thickness. Use of a thin layer of a material having a higher relative permittivity, e.g. $Ta_2O_5$, in place of the conventional $SiO_2$ or $Si_3N_4$ layers is useful in achieving desired performance.

A chemical vapor deposited (CVD) $Ta_2O_5$ film can be used as a dielectric layer for this purpose, because the dielectric constant of $Ta_2O_5$ is approximately three times that of a conventional $Si_3N_4$ capacitor dielectric layer. However, one drawback associated with the $Ta_2O_5$ dielectric layer is undesired leakage current characteristics. Accordingly, although $Ta_2O_5$ material has inherently higher dielectric properties, $Ta_2O_5$ typically may produce poor results due to leakage current. For example, U.S. Pat. No. 5,780,115 to Park et al., discloses the use of $Ta_2O_5$ as the dielectric for an integrated circuit capacitor with the electrode layer being formed of titanium nitride (TiN). However, at temperatures greater than 600° C., this layered structure has a stability problem because the titanium in the TiN layer tends to reduce the $Ta_2O_5$ of the dielectric layer into elemental tantalum.

SUMMARY OF THE INVENTION

In view of the foregoing background, it is therefore an object of the invention to provide a method for producing a low leakage, high quality gate or capacitor dielectric.

This and other objects, features and advantages in accordance with the present invention are provided by a method of fabricating an integrated circuit device including the steps of: forming a tantalum oxide layer adjacent a semiconductor substrate; forming a metal oxide layer on the tantalum oxide layer opposite the semiconductor substrate; and forming a metal nitride layer on the metal oxide layer opposite the tantalum oxide layer. The metal nitride layer includes a metal which may be capable of reducing the tantalum oxide layer, and the metal oxide layer substantially blocks reduction of the tantalum oxide layer by the metal of the metal nitride layer.

The tantalum oxide layer may be formed of tantalum pentoxide, and the metal oxide layer may preferably comprise a titanium dioxide layer. Alternatively, the metal oxide layer may comprise a zirconium dioxide layer, or a ruthenium dioxide layer and preferably has a dielectric constant greater than about 25. The metal nitride layer may be formed of a titanium nitride.

The method may include the step of forming a channel region in a silicon substrate, and the step of forming a silicon oxide layer between the substrate and the tantalum oxide layer. Furthermore, the method may include the step of forming a substantially stress-free interface between the substrate and the silicon oxide layer. Such a step may preferably include annealing the silicon oxide layer and the substrate in an oxidizing atmosphere.

Additionally, a conductive layer, such as a metal layer, may be formed between the substrate and the tantalum oxide layer to define a capacitor with the metal nitride layer. Such a capacitor is preferably formed with a silicon oxide layer between the conductive layer and the tantalum oxide layer and an insulating layer between the substrate and the conductive layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
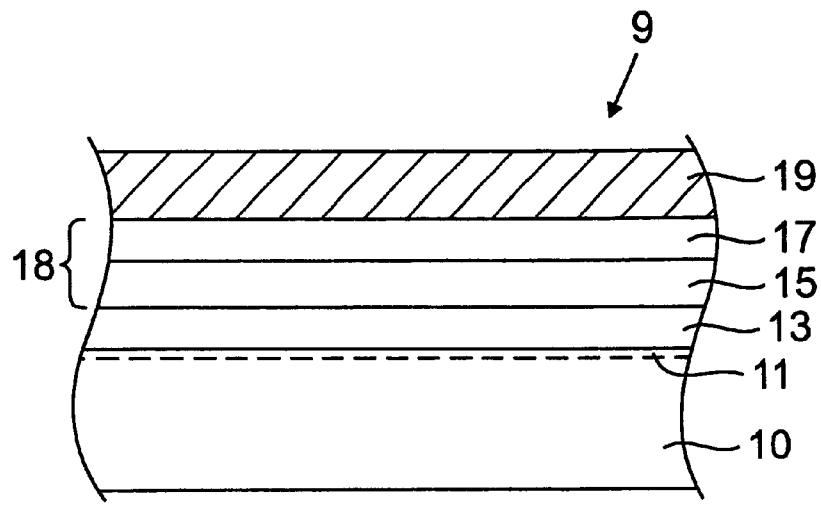
FIG. 1 is a schematic cross-sectional view of an integrated circuit device in accordance with the present invention.

The basic layers of an integrated circuit device 9 according to the present invention will be described with reference to FIG. 1. The device 9 includes a substrate 10 which is made of silicon, for example. An insulation layer 13, typically silicon dioxide, is disposed on the substrate 10. Next, the device 9 includes a first metal oxide layer 15 and a second metal oxide layer 17 on the insulation layer 13. The first metal oxide layer 15 can be formed of, for example, tantalum pentoxide ($Ta_2O_5$), while the second metal oxide layer 17 includes a metal oxide with a relatively high dielectric constant ($\in$), for example, greater than about 25. Such a high dielectric metal oxide preferably includes titanium dioxide ($TiO_2$), and also includes zirconium dioxide ($ZrO_2$) and ruthenium dioxide ($RuO_2$), for example. The first and second metal oxide layers form a high-$\in$ composite dielectric stack 18.

The device 9 includes a metal nitride layer 19 on the second metal oxide layer 17. The metal nitride layer 19 may include titanium nitride (TiN) of which the titanium is capable of breaking down or reducing the metal oxide, e.g. tantalum pentoxide, of the first metal oxide layer 15 into, for example, elemental tantalum, as discussed above. However, the high dielectric second metal oxide layer 17 substantially blocks the breakdown or reduction of the metal oxide of the first metal oxide layer by the metal of the metal nitride layer 19. Thus, the device is stable at temperatures over 600° C. and the use of the high-∈ composite dielectric stack 18 allows scaling for sub-0.25µm devices without tunneling or breakdown.

Additionally, the device 9 may include a second silicon dioxide layer 11 to define an essentially planar and stress-free interface between the substrate 10 and the insulation layer 13. The interface traps defects resulting in the reduction of the defect densities of the insulation layer 13 and substrate 10.

Figure 2:
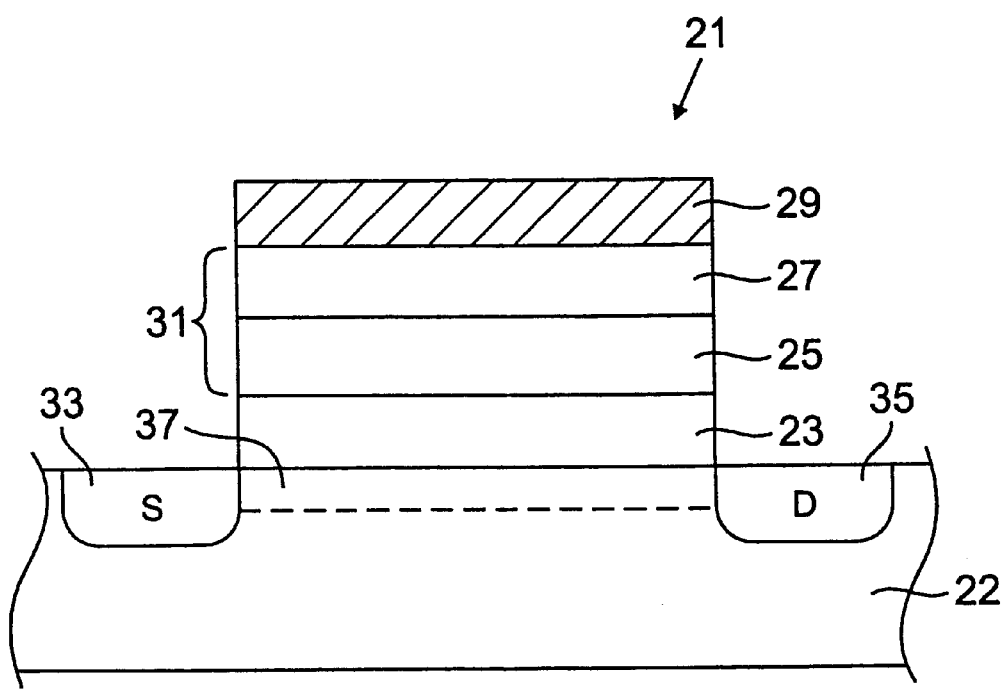
FIG. 2 is a schematic cross-sectional view of a transistor in accordance with the present invention.

A transistor 21 incorporating the high-∈ composite dielectric stack of the present invention, as a gate dielectric, will be described with reference to FIG. 2. The transistor 21 includes a substrate 22 having a source 33, drain 35 and a channel region 37 therein, as would readily be appreciated by the skilled artisan. An insulation layer 23 is disposed above the channel region 37. The transistor includes a high-∈ composite dielectric stack 31 made up of first and second metal oxide layers 25 and 27. Again, the first metal oxide layer 25 can be formed of $Ta_2O_5$, while the second metal oxide layer 27 includes a metal oxide with a relatively high dielectric constant such as $TiO_2$, $ZrO_2$ and $RuO_2$.

The transistor 21 includes a metal nitride layer 29 on the second metal oxide layer 27. The metal nitride layer 29 may include TiN of which the titanium is capable of breaking down or reducing the metal oxide, e.g. tantalum pentoxide, of the first metal oxide layer 25 into, for example, elemental tantalum, as discussed above. However, the high dielectric second metal oxide layer 27 substantially blocks the breakdown or reduction of the metal oxide of the first metal oxide layer 25 by the metal of the metal nitride layer 29.

The transistor may also include an essentially planar and stress-free interface between the substrate 22 and the insulation layer 23. This interface would be formed as described below with reference to the device of FIG. 1.

Figure 3:
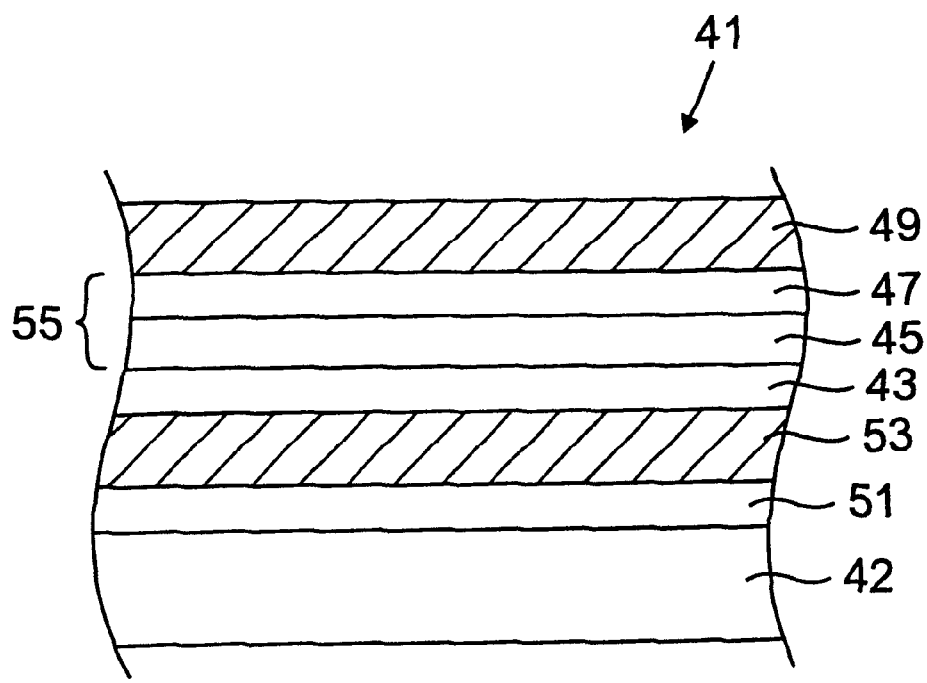
FIG. 3 is a schematic cross-sectional view of a capacitor in accordance with the present invention.

Next, a metal-oxide-metal (MOM) capacitor 41 incorporating the high-∈ composite dielectric stack of the present invention, as a capacitor dielectric, will be described with reference to FIG. 3. The capacitor 41 includes a substrate 42, a first insulation layer 51 and a first metal conductive layer 53, as would readily be appreciated by the skilled artisan. A second insulation layer 43 is disposed on the first conductive layer 53. The capacitor 41 includes a high-∈ composite dielectric stack 55 made up of first and second metal oxide layers 45 and 47. Again, the first metal oxide layer 45 can be formed of $Ta_2O_5$, while the second metal oxide layer 47 includes a metal oxide with a relatively high dielectric constant such as $TiO_2$, $ZrO_2$ and $RuO_2$.

The capacitor 41 includes a second metal conductive layer 49 which includes a metal nitride, such as TiN, of which the titanium is capable of breaking down or reducing the metal oxide of the first metal oxide layer 45, as discussed above. However, the high dielectric second metal oxide layer 47 substantially blocks the breakdown or reduction of the metal oxide of the first metal oxide layer 45 by the metal of the second conductive layer 49.

Figure 4:
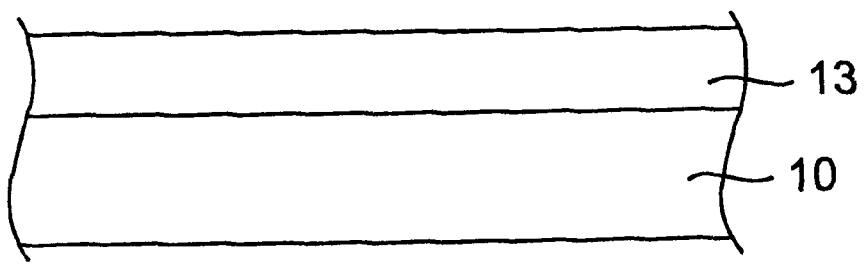
FIGS. 4–8 are schematic cross-sectional views of the steps in accordance with the fabrication method of the present invention.
Figure 5:
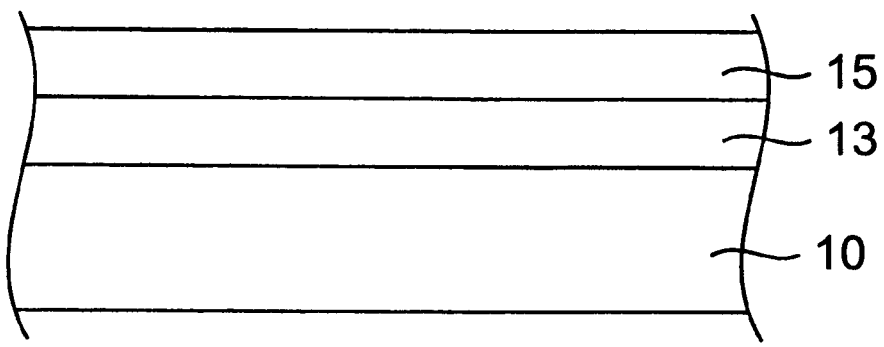
Figure 6:
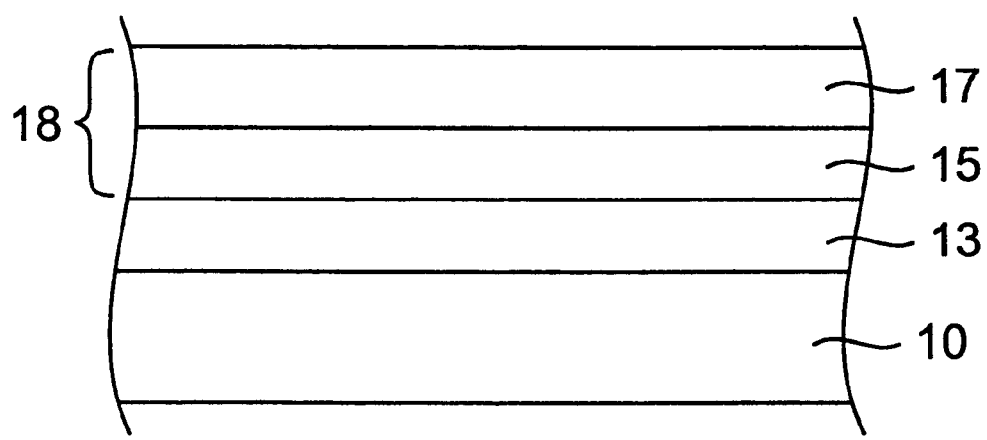

A description of a method of fabricating an integrated device, such as the device 9 of FIG. 1, including a high-∈ composite dielectric stack will be described with reference to FIGS. 4–8. As illustrated in FIG. 4, a silicon substrate 10 is provided and an insulation layer 13 is grown or deposited thereon. As discussed above, this insulation layer is typically $SiO_2$. Next, as shown in FIG. 5, a first metal oxide layer 15, such as $Ta_2O_5$, is deposited using chemical vapor deposition techniques, for example. This is followed by the deposition of a second metal oxide layer 17 as illustrated in FIG. 6. As also discussed above, this second metal oxide layer 17 includes a metal oxide with a relatively high dielectric constant such as $TiO_2$, $ZrO_2$ and $RuO_2$. Again, such a metal oxide is preferably $TiO_2$.

The first and second metal oxide layers 15 and 17 make up the high-∈ composite dielectric stack 18. Furthermore, it is this high dielectric second metal oxide layer 17 which will substantially block the reduction of the metal oxide of the first metal oxide layer 15 by the metal of the subsequently deposited metal nitride layer 19, shown in FIG. 8.

Figure 7:
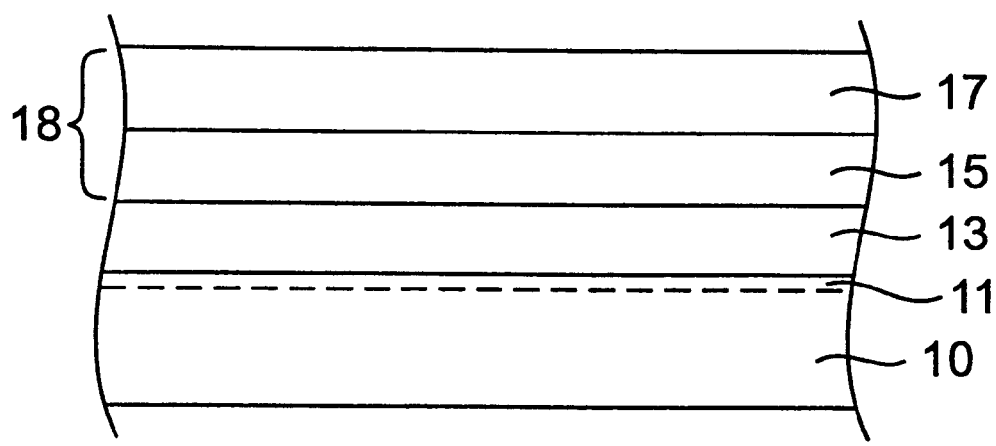
Figure 8:
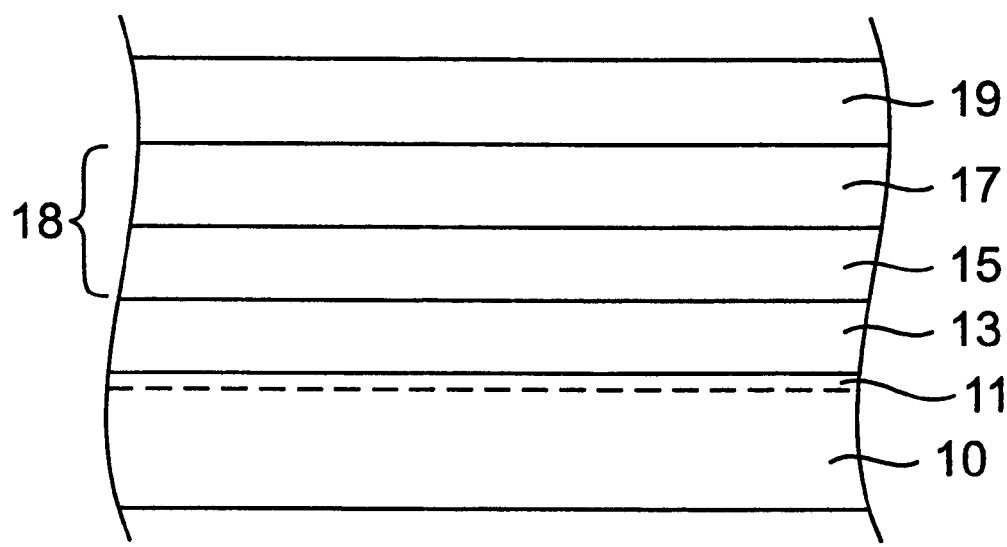

Additionally, as shown in FIG. 7, a second $SiO_2$ layer 11 may be grown before the metal nitride layer 19 is deposited. This second silicon dioxide layer 11 is grown by diffusing oxygen through the first and second metal oxide layers 15, 17 and the insulation layer 13 during an anneal in an oxidizing atmosphere. Also, the growth of the second $SiO_2$ layer 11 occurs in near equilibrium condition and thus has excellent structural properties. This second $SiO_2$ layer 11 growth results in a stress-free and planar interface with desirable interfacial and electrical properties.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for fabricating a semiconductor device comprising the steps of:
   forming a tantalum oxide layer adjacent a semiconductor substrate;
   forming a metal oxide layer on the tantalum oxide layer opposite the semiconductor substrate; and
   forming a metal nitride layer on the metal oxide layer opposite the tantalum oxide layer, the metal nitride layer comprising a metal capable of reducing the tantalum oxide layer;
   the metal oxide layer substantially blocking reduction of the tantalum oxide layer by the metal of the metal nitride layer.

2. A method according to claim 1 wherein the step of forming the tantalum oxide layer comprises forming a tantalum pentoxide layer.

3. A method according to claim 1 wherein the step of forming the metal oxide layer comprises forming at least one of a titanium oxide layer, a zirconium oxide layer, and a ruthenium oxide layer.

4. A method according to claim 1 wherein the step of forming the metal nitride layer comprises forming a titanium nitride layer.

5. A method according to claim 1 wherein the metal oxide layer has a dielectric constant greater than about 25.

6. A method according to claim 1 wherein said substrate comprises silicon; and further comprising the step of forming a channel region in the substrate.

7. A method according to claim 6 further comprising the step of forming a silicon oxide layer between the substrate and the tantalum oxide layer.

8. A method according to claim 7 further comprising the step of forming a substantially stress-free interface between the substrate and the silicon oxide layer.

9. A method according to claim 1 further comprising the steps of:

forming a silicon oxide layer between the substrate and the tantalum oxide layer; and forming a substantially stress-free interface between the substrate and the silicon oxide layer.

10. A method according to claim 9 wherein the step of forming the substantially stress-free interface comprises annealing the silicon oxide layer and the substrate in an oxidizing atmosphere.

11. A method according to claim 1 further comprising the step of forming a conductive layer between the substrate and the tantalum oxide layer to define a capacitor with the metal nitride layer.

12. A method according to claim 11 wherein the step of forming the conductive layer comprises forming a metal layer.

13. A method according to claim 11 further comprising the step of forming a silicon oxide layer between the conductive layer and the tantalum oxide layer.

14. A method according to claim 11 further comprising the step of forming an insulating layer between the substrate and the conductive layer.

15. A method for fabricating a semiconductor device comprising the steps of:

forming a tantalum oxide layer adjacent a semiconductor substrate;

forming a titanium oxide layer on the tantalum oxide layer opposite the semiconductor substrate; and forming a titanium nitride layer on the titanium oxide layer opposite the tantalum oxide layer wherein the titanium oxide layer substantially blocks reduction of the tantalum oxide layer by the titanium of the titanium nitride layer.

16. A method according to claim 15 wherein the step of forming the tantalum oxide layer comprises forming a tantalum pentoxide layer.

17. A method according to claim 15 wherein the titanium oxide layer has a dielectric constant of about 40.

18. A method according to claim 15 wherein said substrate comprises silicon; and further comprising the step of forming a channel region in the substrate.

19. A method according to claim 18 further comprising the step of forming a silicon oxide layer between the substrate and the tantalum oxide layer.

20. A method according to claim 19 further comprising the step of forming a substantially stress-free interface between the substrate and the silicon oxide layer.

21. A method according to claim 15 further comprising the steps of:

forming a silicon oxide layer between the substrate and the tantalum oxide layer; and forming a substantially stress-free interface between the substrate and the silicon oxide layer.

22. A method according to claim 21 wherein the step of forming the substantially stress-free interface comprises annealing the silicon oxide layer and the substrate in an oxidizing atmosphere.

23. A method according to claim 15 further comprising the step of forming a conductive layer between the substrate and the tantalum oxide layer to define a capacitor with the titanium nitride layer.

24. A method according to claim 23 wherein the step of forming the conductive layer comprises forming a metal layer.

25. A method according to claim 23 further comprising the step of forming a silicon oxide layer between the conductive layer and the tantalum oxide layer.

26. A method according to claim 23 further comprising the step of forming an insulating layer between the substrate and the conductive layer.

27. A method of fabricating an integrated circuit device comprising the steps of:

forming a first metal oxide layer, including a metal oxide which is susceptible to reduction, adjacent a substrate;

forming a second metal oxide layer on the first metal oxide layer opposite the substrate; and forming a metal nitride layer on the second metal oxide layer opposite the first metal oxide layer, the metal nitride layer comprising a metal capable of reducing the metal oxide of the first metal oxide layer;

the second metal oxide layer substantially blocking reduction of the metal oxide by the metal of the metal nitride layer.

28. A method according to claim 27 wherein the metal oxide of the first metal oxide layer comprises at least one of tantalum oxide and tantalum pentoxide.

29. A method according to claim 27 wherein the step of forming the second metal oxide layer comprises forming at least one of a titanium oxide layer, a zirconium oxide layer, and a ruthenium oxide layer.

30. A method according to claim 27 wherein the step of forming the metal nitride layer comprises forming a titanium nitride layer.

31. A method according to claim 27 wherein the metal oxide layer has a dielectric constant greater than about 25.

* * * * *